US007598740B2

(12) United States Patent
Fischer et al.

(10) Patent No.: US 7,598,740 B2
(45) Date of Patent: Oct. 6, 2009

(54) RADIO-FREQUENCY COIL ARRANGEMENT

(75) Inventors: Hubertus Fischer, Bamberg (DE);
Oliver Heid, Gunzenhausen (DE);
Martin Hergt, Châtelaine (CH)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/943,808

(22) Filed: Nov. 21, 2007

(65) Prior Publication Data

US 2008/0129296 A1 Jun. 5, 2008

(30) Foreign Application Priority Data

Nov. 22, 2006 (DE) ............ 10 2006 055 136

(51) Int. Cl.
*G01V 3/00* (2006.01)
(52) U.S. Cl. ............................................ 324/318
(58) Field of Classification Search ......... 324/300–322; 600/410–435; 333/219–233; 343/723–730
See application file for complete search history.

(56) References Cited

U.S. PATENT DOCUMENTS

| 4,712,067 | A | * | 12/1987 | Roschmann et al. | ........ 324/318 |
| 5,081,418 | A | * | 1/1992 | Hayes et al. | ................ 324/322 |
| 5,144,240 | A | * | 9/1992 | Mehdizadeh et al. | ........ 324/318 |
| 5,179,332 | A | * | 1/1993 | Kang | ........................... 324/313 |
| 5,367,261 | A | * | 11/1994 | Frederick | ..................... 324/318 |
| 5,430,378 | A | * | 7/1995 | Jones | ......................... 324/318 |
| 5,477,146 | A | * | 12/1995 | Jones | ......................... 324/318 |
| 5,699,802 | A | * | 12/1997 | Duerr | ......................... 600/422 |
| 5,841,288 | A | * | 11/1998 | Meaney et al. | .............. 324/639 |
| 6,580,274 | B2 | * | 6/2003 | Sato | ............................ 324/318 |
| 6,636,040 | B1 | * | 10/2003 | Eydelman | .................... 324/318 |
| 6,727,698 | B1 | * | 4/2004 | Eydelman | .................... 324/318 |
| 6,900,637 | B1 | * | 5/2005 | Seeber | ........................ 324/318 |
| 7,026,818 | B2 | | 4/2006 | Machida et al. | |
| 7,091,721 | B2 | * | 8/2006 | Jevtic | ........................ 324/318 |
| 7,176,689 | B2 | | 2/2007 | Machida et al. | |
| 7,180,291 | B2 | * | 2/2007 | Chmielewski et al. | ...... 324/318 |
| 7,193,418 | B2 | * | 3/2007 | Freytag | ...................... 324/318 |

OTHER PUBLICATIONS

Patent Abstracts of Japan Publication No. 09131332 A, and computer translation of Japanese Application 07314903.

* cited by examiner

*Primary Examiner*—Brij B. Shrivastv
*Assistant Examiner*—Dixomara Vargas
(74) *Attorney, Agent, or Firm*—Schiff Hardin LLP

(57) ABSTRACT

A radio-frequency coil arrangement has a number of conductor traces forming basic coils and with capacitors interconnected in the conductor traces. Conductor traces of various basic coils intersect at node points. At least one switching arrangement for selective, reversible connection of the conductor traces to form different coil geometries is provided at least some of the node points.

17 Claims, 4 Drawing Sheets

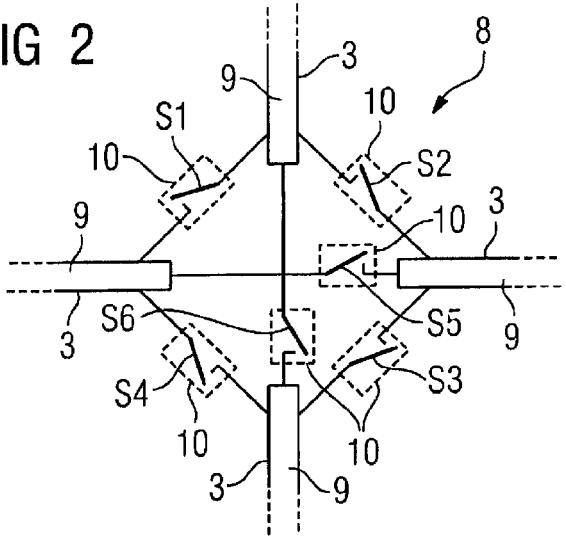
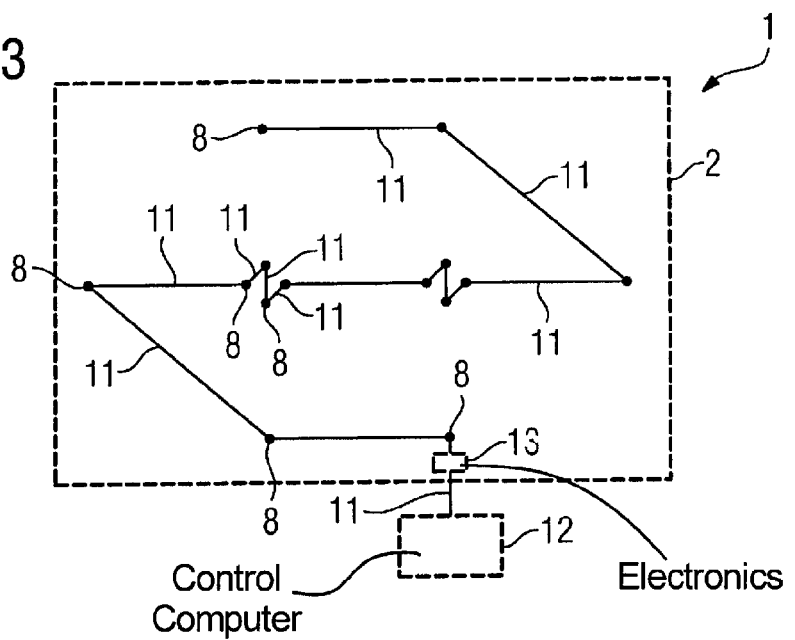
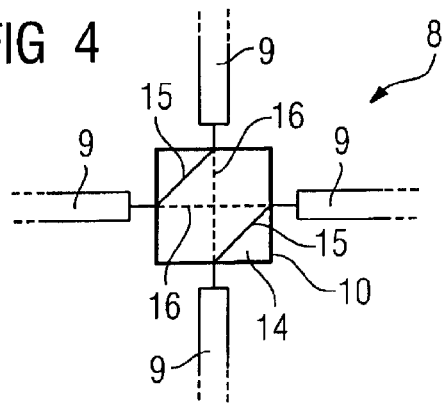

Magnetic Resonance Apparatus

Storage Unit

Control Unit

Input Device

RADIO-FREQUENCY COIL ARRANGEMENT

BACKGROUND OF THE INVENTION

1. Field of the Invention

The present invention concerns a radio-frequency coil arrangement of the type having a number of conductor tracks or traces (paths) forming basic coils with capacitors interlaced within said conductor traces, with conductor traces of various basic coils intersecting at node points.

2. Description of the Prior Art

Radio-frequency coil arrangements of the above type are used in magnetic resonance apparatuses, wherein they fulfill a dual function. They serve for the emission (transmission) of radio-frequency fields for excitation of the nuclear spins in a region to be examined; and they also serve for the reception of the measurement signals. A number of single or basic coils that frequently overlap to form overlap regions are embodied in a radio-frequency coil arrangement. These overlap regions can be designed such that the basic coils are decoupled from one another, meaning that they do not mutually influence one another in the transmission and reception modes.

The size and arrangement of the individual coils of the radio-frequency coil arrangement represents a design criterion. Although a high measurement field with high penetration depth can be achieved with large coils, these exhibit a poor signal-to-noise ratio due to their large area. The signal-to-noise ratio is improved given use of smaller coils but penetration depth and measurement field are therefore reduced. Furthermore, measurement and evaluation time aspects must also be considered.

Radio-frequency coil arrangements are therefore produced in a targeted manner for specific applications, such that various radio-frequency coil arrangements are employed for various application cases. An exchange of the radio-frequency coil arrangement is then required between these applications, which is very complicated or even impossible (in particular given structurally integrated radio-frequency coil arrangements).

SUMMARY OF THE INVENTION

An object of the present invention is to provide a radio-frequency coil arrangement that allows a versatile usage capability in various application fields.

This object is achieved in accordance with the invention by a radio-frequency coil arrangement of the aforementioned type wherein at least one switching arrangement for selective, reversible connection of the conductor traces to form different coil geometries is provided for at least a portion of the node points.

The invention is based on the insight to achieve a radio-frequency coil arrangement that can be set to varying coil geometries. For example, one or a few large coils should be just as realizable as a number of small coils without having to exchange the radio-frequency coil arrangement. This is inventively achieved by the intersecting conductor traces not being directed past one another at the node point; but instead a switching arrangement is provided at (at least) some node points that allow a selection to be made as to which of the ends of the conductor traces at the node point are connected. In addition to the normal case that the conductor traces of a basic coil are connected with one another, other interconnections are also possible such that the different coil geometries can be realized.

A single radio-frequency coil arrangement thus can be advantageously utilized for varying applications. The coils are not just variable in shape and size, but also specific coils can be singled out (activated) and others deactivated, for example.

A reduction of the measurement times can also be achieved with the inventive radio-frequency coil arrangement by suitable selection of the coil geometry. Depending on the body region, the sensitivity can be individually adjusted using the coil geometry. The duration of the data acquisition is thereby predetermined, which in many cases saves a significant time expenditure in conducting the overall examination. Faster reconstruction times can be achieved depending on the sensitivity, in particular given parallel imaging.

For larger radio-frequency coil arrangements it is also conceivable to produce a coil geometry in which coils exhibit different sizes in specific regions. For example, if specific data from body areas should thus be acquired with higher sensitivity, the smallest possible coils (in particular the basic coils) can be used in this region. Other regions in which a lower resolution is required use larger coils, such that readout and reconstruction can be implemented faster and less data produced.

In the transition from the basic coils to the larger and differently shaped coils, it should be noted that the resonance is usually shifted. This means that the desired sensitivity of the newly formed coil would then not be as desired since the interconnected capacitors are not tuned to the inductance of the coil. Means can therefore be provided in order to reestablish the resonance conditions. For this purpose, a portion of the capacitors can be fashioned as capacitance diodes. Such capacitance diodes (also called varactor diodes) are characterized by a different capacitance thereof being able to be set. An elegant way is thus provided to achieve the resonance conditions for various coil geometries. The capacitance diodes can be operated in a reactive range, i.e. in a blocking range. Since no current thus flows, no additional noise due to resistances occurs, such that the signal-to-noise ratio is barely worsened. A direct voltage source whose momentary voltage value determines the capacitance value is associated with each capacitance diode.

If the overlap regions of the basic coils are dimensioned such that decoupling of the individual basic coils is enabled via the overlap, this decoupling can be lost due to variation of the coil geometry. This can be countered in various ways that can also be combined with one another.

First, it is possible to select the coil geometry such that the overlap regions can also perform in a decoupled manner given the new interconnection of the conductor traces. For example, adjacent overlap regions can be interconnected in a cross-over and thus be used further.

Furthermore, coil geometries can be selected such that coils separated from one another are achieved upon divergence from the basic coils. These then do not, or only slightly, reciprocally influence one another.

The effects that the individual coils exert on one another can also be mathematically described. It is then possible for a decorrelation of the coils to ensue in the framework of the image processing or reconstruction.

There is also the possibility of a capacitive decoupling by suitable adaptation of the capacitances, in particular with the aforementioned use of the capacitance diodes.

Naturally, in such a radio-frequency coil arrangement the connections of the individual coils are provided such that, in all conceivable coil geometries, each coil can be suitably controlled so the transmission and the reception signals can be conducted to and from the coil, respectively. The precise arrangement of the coil connections is dependent on the specific embodiment of the radio-frequency coil arrangement.

The basic coils can be essentially rectangular or also essentially circular. Given rectangular coils, for example, frequently connection lines running at an angle are provided in the corner regions. The corresponding intersection points with the conductor traces of adjacent coils then also lie in these conductor trace regions running at angles. The conductor traces, which are otherwise fashioned wide (for example as copper strips), are fashioned narrow in the region of these node points. These narrow conductor trace segments at the node points can now be selectively connected with one another by the inventively provided switching arrangement in order to generate various coil geometries.

A number of embodiments are also possible for the concrete embodiment of the switching arrangement. The switching arrangement can thus fashioned as electrostatic relays and/or semiconductor switches and/or galvanic switches. An electrostatic relay in which, for example, various connections of conductor traces can be effected simultaneously by means of a single device, has the advantage that the relay as a single switching means is possibly already sufficient. Such a relay with various positions associated with different coil geometries could then be provided at each node point. Connections of specific conductor trace segments of the node can alternatively be established or interrupted by semiconductor switches or galvanic switches, the switches then being respectively associated with a specific connection section. Semiconductor switches (in particular CMOS switches) are preferable, since these exhibit only a small capacitance.

If individual switches are used as the switching arrangement, six switches can be appropriately provided at each switchable node point. By means of six such switches, it is possible to establish every possible connection of the four conductor trace segments arriving at the node point, such that in this embodiment a greatest flexibility and design freedom exist with regard to the possible coil geometries.

The activation of the switching arrangement can appropriately ensue via a control device. Belonging to the control device in the sense of the present invention are all components that enable an activation of the switching arrangement. The radio-frequency coil arrangement thus can include separate electronics with which the activation ensue, but it is also possible, for example, for relays to be brought into a further position via a simple signal as an external activation, such that no further electronics are required in the radio-frequency coil arrangement.

Control signals that are directed toward the various switching arrangement are generated by the control device. A bus system for transfer of these control signals can be provided. Each switching arrangement can be individually addressed in such a bus system.

Two embodiments are available for transfer of the control signals to the switching arrangement. The control device can include conductors for transfer of the control signals for activation of the switching arrangement or switching arrangements. A separate line can be directed to each of the switching arrangements; for example, in the case of a bus system it is also possible for that the individual switching arrangements to be sequentially connected with one another. The control device can advantageously be fashioned for return conduction of the control signals via the conductor traces such that extra conductor sections are avoided.

In an alternative embodiment, the control device can be fashioned to transfer the control signals for activation of the switching arrangements via the conductor traces. No additional conductors are required in this embodiment, but a temporally offset activation of the various switching arrangements is then required (in particular given more complex geometric arrangements) since an isolation of individual conductor traces and thus of node points can occur internally.

Two control variants that can also be operated in parallel are possible. Specific, preset coil geometries can be selected. This means that the settings of the switching means for specific, frequently used or particularly advantageous coil geometries are stored, for example, in a storage unit such that these can be selected in a simple manner. It is conceivable to establish respective preset coil geometries for acquisitions of various organs or body parts. Tables are also possible in which a coil geometry can be selected using the body region to be acquired and further acquisition parameters, for example the desired resolution.

Alternatively or additionally, the switching arrangements can be individually controllable, meaning that the concrete switch setting can be selected independently for each switching arrangement. A large design freedom is thereby achieved.

The (possibly preset) coil geometry can be selected either by an operating personnel or by a control computer of a magnetic resonance apparatus. The automatic selection can ensue, for example, from such a control computer using knowledge about the region to be acquired and other acquisition parameters. A user can make the selection through a correspondingly designed input device.

The specific design of the radio-frequency coil arrangement can be selected in various ways. The radio-frequency coil arrangement thus can be fashioned as a whole-body coil arrangement or as a local coil arrangement, in particular as a head coil arrangement or local coil arrangement to be placed on the body. The conductor traces can be arranged on a circuit board or a flexible plastic sheet. Given the arrangement on a flexible plastic sheet, it is possible to place the radio-frequency coil arrangement on a patient such that it adapts to his or her shape, and thus a good proximity to the body regions to be examined is enabled. In both cases it is possible to arrange conductors (if present) for transfer of the control signals for the switching means on the side opposite the conductor traces, possibly behind an isolation (insulation) layer.

Such a radio-frequency coil arrangement can also be integrated at least in part into a patient bed of a magnetic resonance apparatus.

In addition to such a radio-frequency coil arrangement, the invention also concerns a magnetic resonance apparatus embodying a radio-frequency coil arrangement as described above.

As noted above, an automatic control of the radio-frequency coil arrangement can therewith ensue dependent on the various application cases, possibly using possible further systems of the magnetic resonance apparatus. For this purpose, the magnetic resonance apparatus can have a control computer fashioned to control the radio-frequency coil arrangement. Acquisition parameters are now known to the control computer, for example by input by a user via a corresponding input device. For example, the information of which body region should be acquired with which signal quality or resolution can serve for selection and adjustment of a specific coil geometry. These can be the aforementioned preset coil geometries, but it is also possible for the control computer to determine a coil geometry adapted to the specific case and to individually control the switching arrangements.

The data of further systems of the magnetic resonance apparatus can also be advantageously taken into account. Thus a patient position detection system and/or patient positioning system and/or a system for determination of the position of the radio-frequency coil arrangement can be provided, and the control computer can be fashioned to take data of the system or systems into account in controlling the radio-frequency coil arrangement. A system for determination of the position of the radio-frequency coil arrangement is naturally required only when the radio-frequency coil arrangement does not stand in a fixed geometric relation to the magnetic resonance apparatus. For example, in such an embodiment it is possible that a patient is suitably positioned by a patient positioning system for, for example, acquisition of an image of the liver. From the positioning and the knowledge of which organ should be acquired, the control computer can now determine an optimal coil geometry and suitably control the radio-frequency coil arrangement.

BRIEF DESCRIPTION OF THE DRAWINGS

FIG. 2 shows an example for interconnection at a node point.

FIG. 3 shows an exemplary course of conductors on the back side of the radio-frequency coil arrangement.

FIG. 4 shows a second example for interconnection at a node point.

DESCRIPTION OF THE PREFERRED EMBODIMENTS

Figure 1:
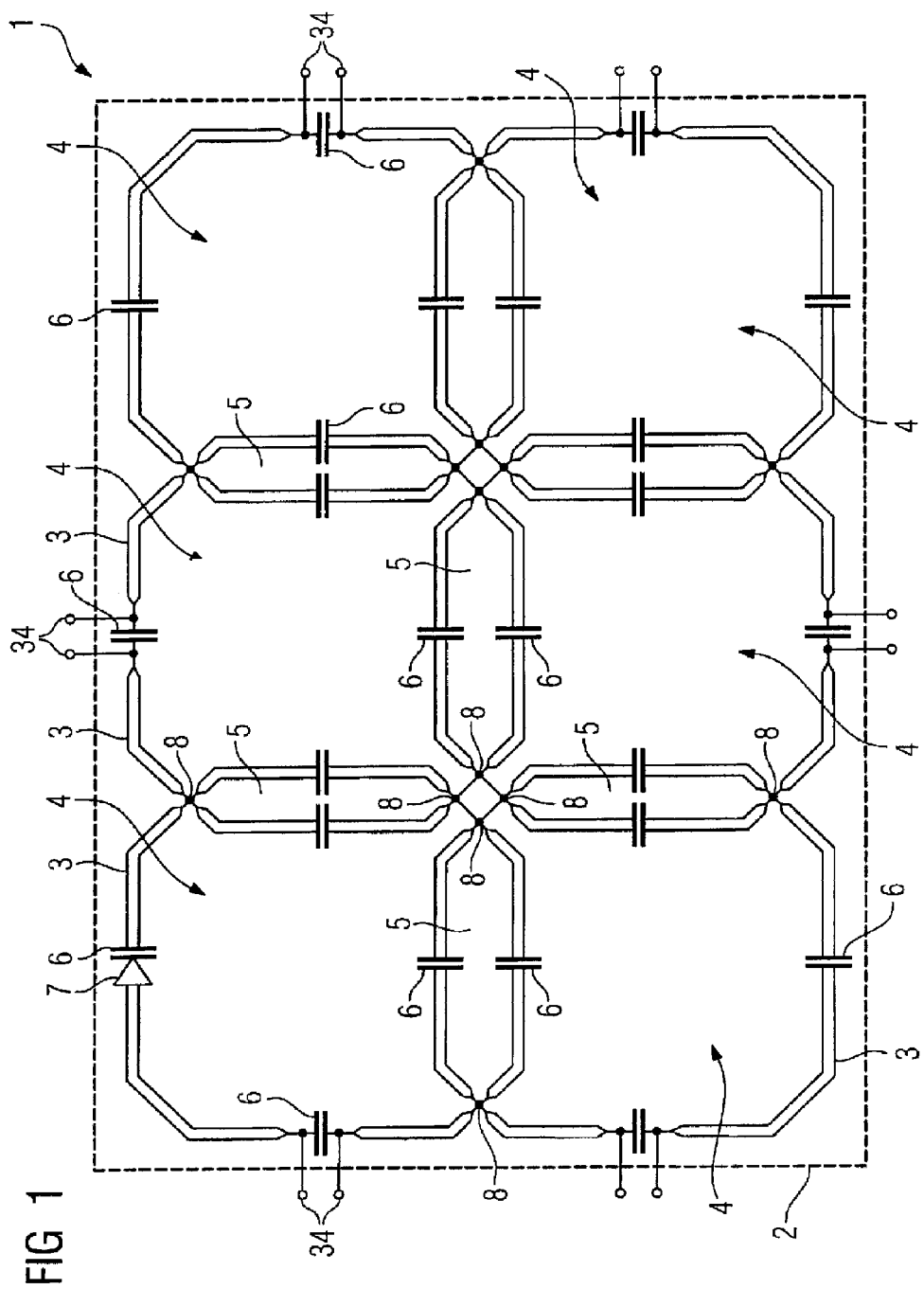
FIG. 1 is a plan view of a first embodiment of a radio-frequency coil arrangement in accordance with the invention.

FIG. 1 shows an inventive radio-frequency coil arrangement 1 according to a first embodiment. The coil arrangement 1 has a circuit board 2 on which are arranged conductor traces 3 that form the basic coils. In this case six essentially rectangular basic coils 4 are provided, but the coil matrix can be arbitrarily enlarged. The basic coils 4 overlap in overlap regions 5 that contribute to the decoupling of the individual basic coils 4 (geometric decoupling).

Additionally, capacitors 6 that are required for the adjustment of the correct resonance behavior with regard to the inductance of the basic coils 4, and can possibly also contribute to the decoupling, are interconnected in the conductor traces 3. At least some of the capacitors 6 can be designed at as capacitance diodes or varactor diodes 7 in which the capacitance can be set by means of a direct voltage thereto. All capacitors 6 can also be fashioned as capacitance diodes 7. Given different coil geometries the resonance condition can be maintained via the variable capacitances of the capacitance diodes 7.

External connections 34 are also associated with each of the basic coils 4, via which external connections 34 a corresponding radio-frequency signal is provided to the coils upon transmission or, respectively, reception signals can be tapped upon reception.

As is also apparent from FIG. 1, the conductor traces 3 are fashioned as broad copper strips at a distance from the node points 8 that taper to narrower conductor trace segments in the region of the node points 8.

The radio-frequency coil arrangement presented in FIG. 1 with conductor traces 3 arranged on the circuit board 2 can, for example, be integrated into the patient bed of a magnetic resonance apparatus. A design as a local coil arrangement to be placed on a patient is additionally also conceivable. It is then possible to provide openings in the region of the circuit board 2 that are not occupied by conductor traces 3, through which openings a view of the patient is enabled, and material can be saved.

Due to the overlap regions 5, intersecting conductor traces 4 of various basic coils arise at node points 8. At least one switching arrangement is provided at these node points 8 (here fourteen in number). Each switching arrangement allows various connections of the converging four conductor trace segments to be selectively and reversibly enabled, as is explained in detail with regard to FIGS. 2 and 4.

FIG. 2 shows the interconnection at a node point 8. Four segments 9 of the conductor traces 3 meet at each of these node points 8. In the present case, six switching arrangements 10 are provided that here are fashioned as switches S1-S6. Any connection between the conductor trace segments 9 can be achieved via these six switches S1-S6.

If, for example, the six basic coils 4 should be used as a coil geometry, the switches S5 and S6 are thus closed at every node point 8 while the switches S1 through S4 are open. The state is then provided that is known from conventional radio-frequency coil arrangements, namely that two conductor traces 3 of different basic coils 4 intersect without contact at an intersection point.

With the inventively provided switching arrangements 10 it is possible to attain arbitrary coil geometries in that the switches S1 through S6 of each node point 8 are correspondingly activated.

Both galvanic switches and semiconductor switches can be used as switches S1-S6. Semiconductor switches have the advantage that they represent a lower additional capacitance.

Various variants are conceivable for controlling the switching arrangements 10. An example is shown in FIG. 3, which shows the back side of the circuit board 2 of the radio-frequency coil arrangement 1. Conductors 11 for transfer of the control signals for activation of the switching arrangements 10 are clearly provided. The conductors 11 respectively connect the switching arrangements 10 of the individual node points 8 with one another. One connection is sufficient since a bus system is used via which the corresponding control signals are transmitted to the addressable switching arrangements 10 (for example the switches S1 through S6). The return line ensues via the conductor traces 3.

The control signals are generated by an external control computer 12; but the radio-frequency coil arrangement 1 can also have a separate electronics 13.

The control variant presented here as a bus system and return line via the conductor traces 3 is only one possible variant of the control concept. Separate conductors could thus also be provided for the return line of the signals of the bus system. It is just as conceivable (but less advantageous due to the complicated wiring) to direct separate conductors to every single switching arrangement 10.

The activation can also make use of the conductor traces 3 themselves to transfer the control signals in the framework of a bus system. A temporal sequence of the control signals is necessary when, for example, specific node points 8 cannot directly receive control signals due to the current interconnection.

An individual control of the individual switching arrangements 10 can ensue, but it is also conceivable for settings for predetermined coil geometries to be selected. These are then stored in a storage unit of the control computer 12 or the electronics 13 and can be retrieved as needed, so that each switching arrangement 10 does not need to be individually, laboriously set. The predetermined coil geometries can be established, for example, for specific acquisition parameters or for specific body regions, possibly also in combination in a table.

FIG. 4 shows a further variant of the embodiment of a node point 8 of the radio-frequency coil arrangement 1. In this case only one switching arrangement 10 (namely a relay 14) is provided with which the conductor trace segments 9 can be connected in various ways. Shown here by means of the solid lines 15 and the dashed lines 16 are only two possibilities; a larger number of settings are also conceivable.

FIGS. 5A-5E show possible coil geometries that can be set with the inventive radio-frequency coil arrangement 1. A large number of further geometries are conceivable; the shown examples are to be understood only as such. For simplicity, only the active conductor traces 3 and thus the effectively utilized coils are respectively shown.

Figure 5A:
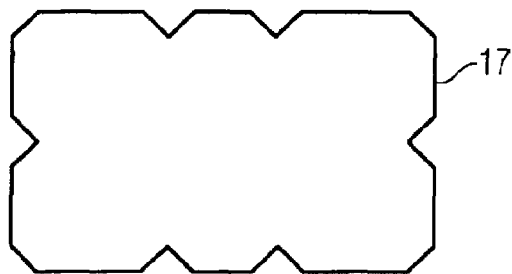
FIGS. 5A-5E show possible coil geometries that can be set in the radio-frequency coil arrangement.

FIG. 5A shows a coil geometry in which a single maximally large coil 17 is used instead of the six small basic coils 4. A large magnetic field, a high penetration depth and a faster measurement can therewith be enabled, but a poorer signal-to-noise ratio must be accepted.

Figure 5B:
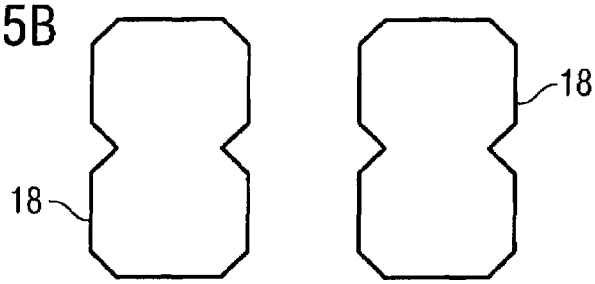

FIG. 5B shows a coil geometry in which two coils 18 spaced separate from one another, which two coils 18 are respectively twice as large as a basic coil 4. A decoupling is enabled by the spacing of the two coils 18.

Figure 5C:
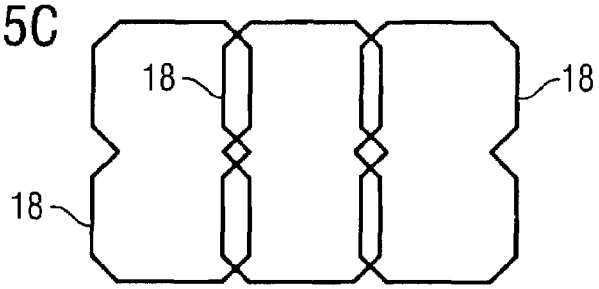

FIG. 5C shows the use of three coils 18 of doubled size, whereby the interconnection in the overlap regions is selected such that an optimally good decoupling already exists. A further decoupling can ensue, for example, by a mathematical correction.

Figure 5D:
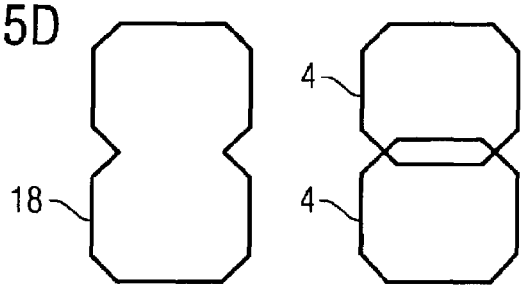

FIG. 5D shows a coil geometry in which locally differing acquisition parameters are realized. A coil 18 that exhibits double the size of the basic coils 4 is provided in the left region of the radio-frequency coil arrangement 1. Two basic coils 4 spaced apart from said coil 18 are used in the right region of the radio-frequency coil arrangement 1.

Figure 5E:
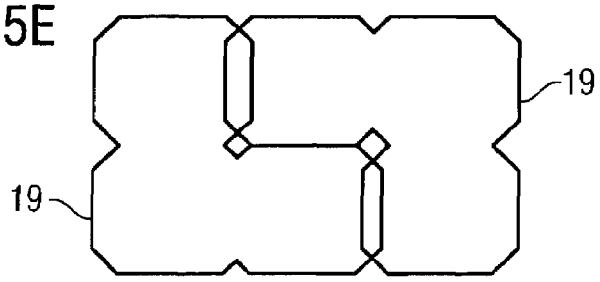

FIG. 5E illustrates the freedom in the selection of the shape of the employed coils. Two coils 19 that are respectively created by interconnection of three of the rectangular basic coils 4 are used in this coil geometry.

Figure 6:
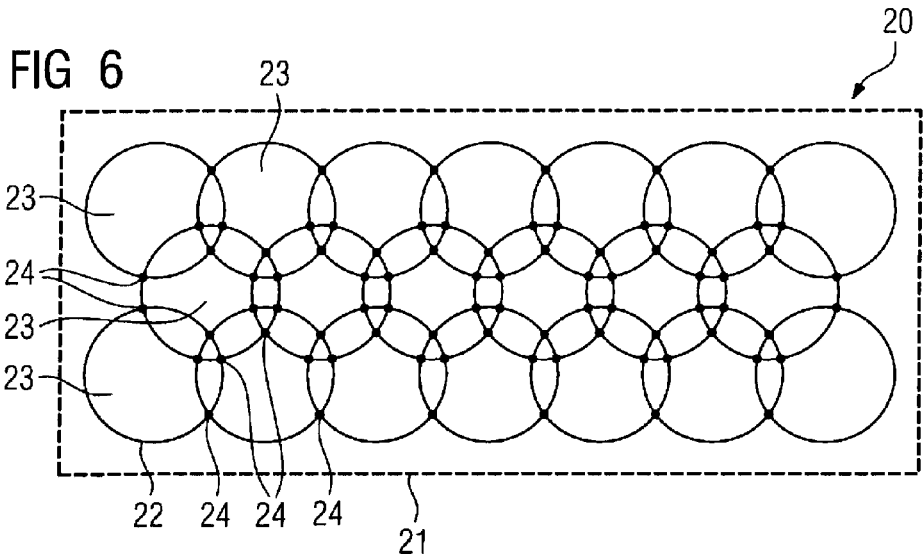
FIG. 6 is a plan view of a second embodiment of a radio-frequency coil arrangement.

A further embodiment of a radio-frequency coil arrangement 20 is shown in FIG. 6. Here conductor traces 22 arranged on a flexible plastic 21 form circular basic coils 23 arranged offset that are respectively decoupled via overlap regions. The conductor traces 22 here also form intersection points 24 at which switching arrangements are provided (as shown, for example, in FIGS. 2 and 4) that allow a selective connection of the segments of the conductor trace 22 meeting there. For example, such a radio-frequency coil arrangement 20 forms what is known as a coil cover that can be placed over a patient or the body region thereof to be examined.

Figure 7:
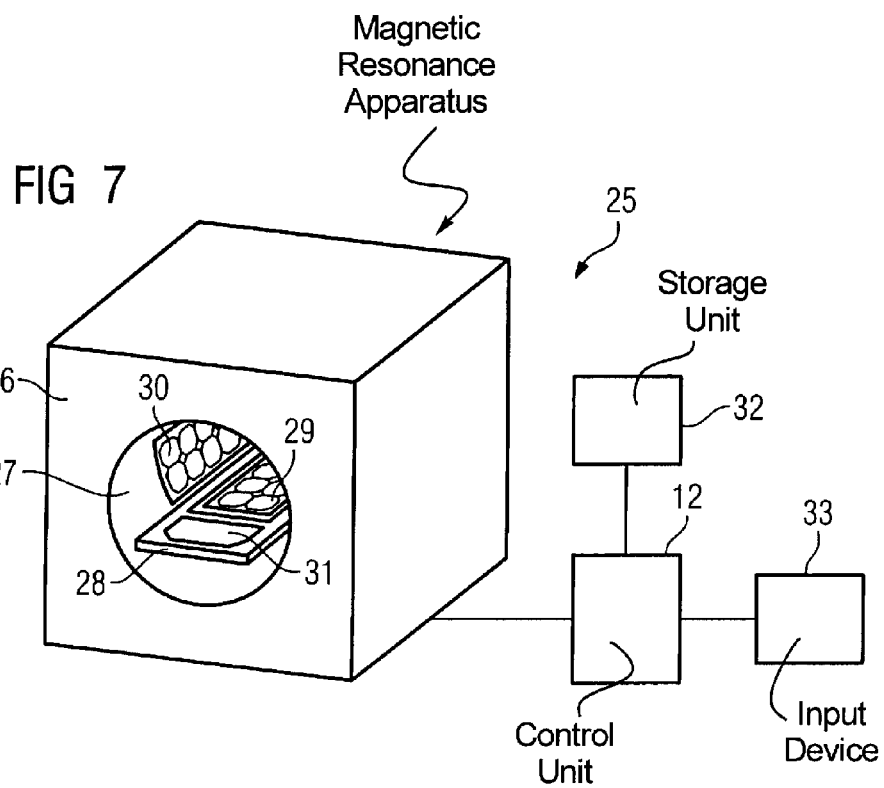
FIG. 7 schematically illustrates an inventive magnetic resonance apparatus.

FIG. 7 shows an inventive magnetic resonance apparatus 25. A patient opening 27 into which a patient bed 28 can be driven is present in a housing 26 in which, for example, the basic field magnet and the gradient coils are provided. An inventive radio-frequency coil arrangement 29 is integrated into the patient bed 28. Alternatively or additionally, a further radio-frequency coil arrangement 30 is attached on the patient bed 28 as a coil cover that can be placed over a patient. An inventive radio-frequency coil arrangement 31 fashioned as a head coil is also conceivable. All provided radio-frequency coil arrangements 29, 30, 31 are controlled by the control computer 12 of the magnetic resonance apparatus 25. This determines or selects a coil geometry that is optimal for the desired acquisition parameters, in particular the body region to be acquired and the acquisition quality. Different coil geometries and/or tables can be stored in a storage unit 32 that is accessible by the control computer 12. Data of a system for determination of the position of a patient and/or for patient position can thereby also be advantageously used, such that (for example) small coils are formed near to the body region of interest while larger coils or no coils at all are provided further away. An automatic adaptation of the coil geometry top the specific acquisition to be implemented is possible in this manner.

Naturally it is also possible for the adjustment of the coil geometry to be selected by a user via an input device 33.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency coil arrangement comprising:
   a plurality of conductor traces forming a plurality of basic radio-frequency coils with capacitors interconnected in said conductor traces, respective conductor traces of respective different ones of said basic coils intersecting at node points, and each basic radio-frequency coil exhibiting a basic coil configuration; and
   at least some of said node points being switchable node points comprising at least one switching arrangement operable to selectively, reversibly connect or disconnect the conductor traces at that switchable node point to cause the respective basic radio-frequency coils having said conductor traces at said switchable mode to point to deviate from said basic configuration to allow selective, reversible formation of a plurality of different coil geometries.

2. A radio-frequency coil arrangement as claimed in claim 1 wherein said conductor traces have a configuration giving said basic coils a substantially rectangular configuration as said basic coil configuration.

3. A radio-frequency coil arrangement as claimed in claim 1 wherein said conductor traces have a configuration giving said basic coils substantially circular configuration as said basic coil configuration.

4. A radio-frequency coil arrangement as claimed in claim 1 wherein each switching arrangement is a switching arrangement selected from the group consisting of electrostatic relays, semiconductor switches, and galvanic switches.

5. A radio-frequency coil arrangement as claimed in claim 1 wherein each switchable node point comprises a switching arrangement comprising six switches.

6. A radio-frequency coil arrangement as claimed in claim 1 comprising a control device connected to each switching arrangement that operates the respective switching arrangements to make and reverse said connections of the conductor traces.

7. A radio-frequency coil arrangement as claimed in claim 6 wherein said control device comprises a bus system.

8. A radio-frequency coil arrangement as claimed in claim 6 wherein said control device comprises conductors that transmit control signals to respective switching arrangements.

9. A radio-frequency coil arrangement as claimed in claim 8 wherein said control device uses at least some of said conductor traces as a return conductor for said control signals.

10. A radio-frequency coil arrangement as claimed in claim 6 wherein said control device transmits said control signals via the conductor traces to the respective switching arrangements.

11. A radio-frequency coil arrangement as claimed in claim 6 wherein said control device selects among a plurality of preset coil geometries and selectively operates said switching arrangements to produce a selected one of said preset coil geometries at a time.

12. A radio-frequency coil arrangement as claimed in claim 6 wherein said control device individually operates said switching arrangements.

13. A radio-frequency coil arrangement as claimed in claim 1 wherein at least some of said capacitors are capacitance diodes.

14. A radio-frequency coil arrangement as claimed in claim 1 comprising a surface on which said conductor traces are arranged, said surface being selected from the group consisting of circuit boards and flexible plastic sheets.

15. A radio-frequency coil arrangement as claimed in claim 1 wherein said conductor traces forming said basic coils are configured to form a magnetic resonance coil arrangement selected from the group consisting of whole-body coil arrangements and local coil arrangements.

16. A radio-frequency coil arrangement as claimed in claim 1 comprising a patient bed configured to move into and out of a magnetic resonance apparatus, on which said plurality of conductor traces forming said basic coils are arranged.

17. A magnetic resonance apparatus comprising:
a magnetic resonance data acquisition unit configured to interact with a subject to acquire magnetic resonance data therefrom; and
a radio-frequency coil arrangement that participates in the acquisition of said magnetic resonance data, said radio-frequency coil arrangement comprising a plurality of conductor traces forming a plurality of basic radio-frequency coils with capacitors interconnected in said conductor traces, respective conductor traces of respective different ones of said basic coils intersecting at node points, and each basic radio-frequency coil exhibiting a basic coil configuration, and at least some of said node points being switchable node points comprising at least one switching arrangement operable to selectively, reversibly connect or disconnect the conductor traces at that switchable node point to cause the respective basic radio-frequency coils having said conductor traces at said switchable mode to point to deviate from said basic configuration to allow selective, reversible formation of a plurality of different coil geometries.

* * * * *